Figure 4:
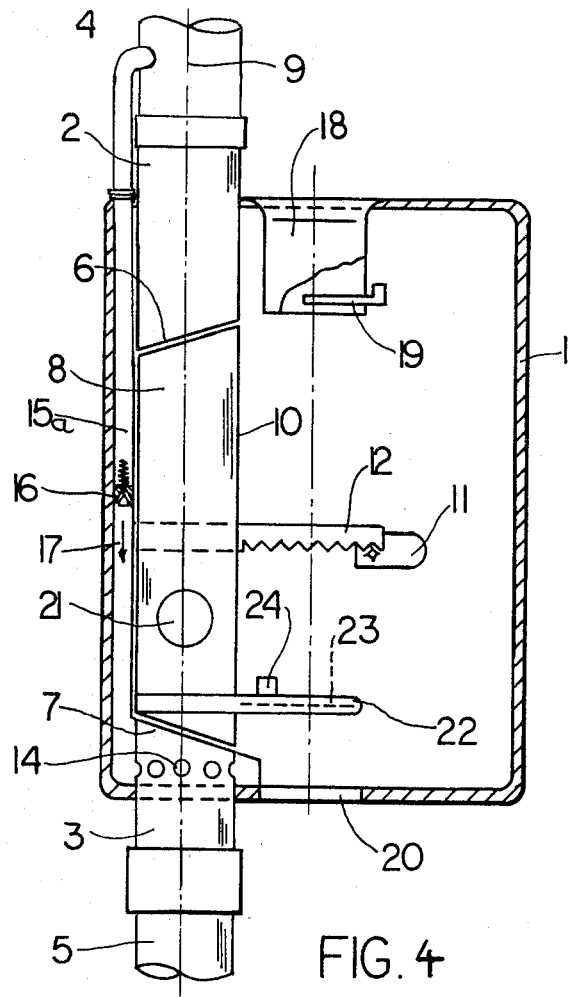

United States Patent [19]
Stangl

[11] 4,256,418
[45] Mar. 17, 1981

[54] ROHRPOSTSTATION (PNEUMATIC-TUBE STATION)

[75] Inventor: Wilfried Stangl, Salzburg, Austria

[73] Assignee: Aerotrans Rohrpostanlagen Gesellschaft m.b.H., Salzburg, Austria

[21] Appl. No.: 14,516

[22] Filed: Feb. 23, 1979

[30] Foreign Application Priority Data

Feb. 24, 1978 [AT] Austria ................................ 1373/78

[51] Int. Cl.³ .............................................. B65G 51/34
[52] U.S. Cl. ...................................... 406/112; 406/84
[58] Field of Search .............. 406/110, 112, 147, 148, 406/176, 177, 179, 180, 84

[56] References Cited

U.S. PATENT DOCUMENTS 4,047,677  9/1977  Hochradel et al. ................... 406/110

FOREIGN PATENT DOCUMENTS 2291129  6/1976  France ..................................... 406/110
1333596 10/1973 United Kingdom ..................... 406/112

Primary Examiner—James L. Rowland
Attorney, Agent, or Firm—Martin A. Farber

[57] ABSTRACT

A pneumatic tube station with a displaceable tube portion which can be moved parallel to itself out of a continuous delivery tube, and respectively, which can be inserted into the delivery tube, which displaceable tube portion in the position inserted into the delivery tube is connected at both ends with the delivery tube by means of respectively one seal each. In the vicinity of one end of the displaceable tube portion there is provided a slider. The slider closes the displaceable tube portion when the slider is in the inserted condition. The two ends of the delivery tube are connected with each other by means of an air channel. The displaceable tube portion in its position in which it is moved out of the delivery tube, is arranged between a storage hopper and a discharge opening, the hopper being provided with a blocking device.

10 Claims, 4 Drawing Figures

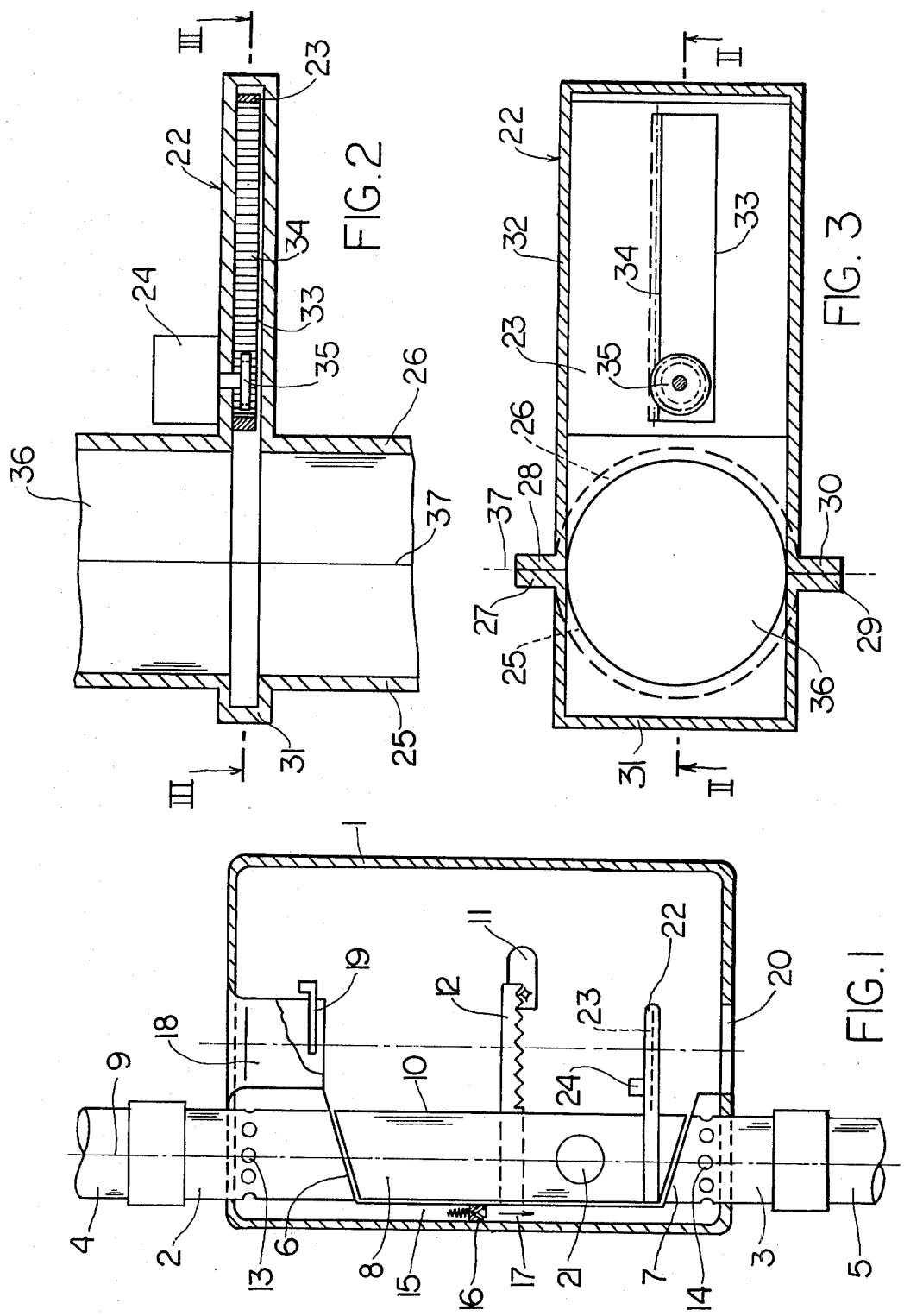

ROHRPOSTSTATION (PNEUMATIC-TUBE STATION)

The invention relates to a pneumatic-tube station with a displaceable tube portion which can be moved parallel to itself out of a continuous delivery tube, and respectively, which can be introduced into the delivery tube, which displaceable tube portion in the position inserted into the delivery tube is connected at both ends with the delivery tube by means of respectively one seal each.

In pneumatic-tube stations of this kind, the displaceable tube portion in one position forms a part of the delivery tube, through which delivery tube pneumatic-tube carriers intended for another pneumatic-tube station can pass without hinderance. Pneumatic-tube stations of this nature have become known in which the displaceable tube portion was removed from the delivery tube by means of a remote control means for the purpose of receiving a pneumatic-tube carrier and in place of the removed tube portion, a carrier deflector member was placed, on which the carrier could slide out of the delivery tube into a receiving container. Similarly, in case a pneumatic-tube carrier was to be dispatched, the tube portion was removed from the delivery tube and the pneumatic-tube carrier that was to be dispatched was fed into the delivery tube via a conveyor or feed means. For this purpose in many cases, the tube portion was constructed to be pivotal, so that in one position it formed a part of the delivery tube, while on the other hand in the position in which it was pivoted out, it served to receive a pneumatic-tube carrier, which carrier was to be dispatched, and which carrier had been inserted into a storage tube, and which carrier means was held therein by a blockage or obstruction.

Since the tube portion in that position in which it forms a part of the continuous delivery tube must be connected air-tightly to the delivery tube and must be able to withstand relatively high air pressures, the demands made on the required seals are high.

In those constructions in which the tube portion is formed pivotally, the tube portion was connected to the delivery tube via an elastic folding bellows at the end of the tube portion which contained the pivot axis, whereas at the other end the seal was made by means of a sealing ring. In so doing, it was necessary to make the pivotal tube portion in such a manner that it would also be movable in the axial direction, so that the end of the tube portion that was opposite from the bellows, can in its pivoted condition be pressed against the end of the delivery tube. It is evident that a large structural expense is required for this. In addition, after some operating period, folding bellows become leaky. Even a single leaking bellows, however, prevents flawless functioning of the pneumatic-tube installation, which is found to be particularly disadvantageous when there is a large number of pneumatic-tube stations, since most often it is not simple to find the position of the leak.

By Pat. AT No. 317 767, a pneumatic-tube station is known in which at least one dividing surface or joint face (which dividing surface separates the delivery tube from the displaceable tube portion and which dividing surface contains the seal) was inclined toward the axis of the delivery tube in the form of an inclined seat, whereby the longest generatrix of the tube portion (which generatrix is formed by the dividing surface) lies at that side of the delivery tube at which the tube portion can be moved out of the delivery tube.

Above all with this it is achieved that an axial movement of the tube portion is not required for bringing about a flawlessly sealed connection to the delivery tube, because by the wedge-like effect caused by means of the inclined seat, a high contact pressure is achieved. This also makes it unnecessary to use a folding bellows for providing an air-tight connection of one end of the tube portion with the adjoining delivery tube, since at this end also a seal can be provided, which seal depending on the configuration of the dividing surface or joint face between the tube portion and the delivery tube, can be circular or elliptical, whereby the tube portion can also be made pivotal in the customary manner.

All known pneumatic-tube stations, which have pivotal or withdrawable tube portions with two or more operating positions, generally require several tube switches, for controlling the necessary functions, whereby structural difficulties occur, particularly in connection with the non-objectionable braking or slowing down of incoming pneumatic-tube carriers, above all when these carriers are conveyed at high speeds and carrying a heavy transport load, even when the braking of incoming pneumatic-tube carriers is effected by the aid of air cushions. Beyond that, in view of the requisite stress in all previously known pneumatic-tube stations which have been installed in delivery tubes as through-transit stations, the load carrying components such as the housing frame, suspensions and the like, were made from metal, and the displaceable tube portions from pneumatic-tube tubing, so that manufacture was correspondingly expensive.

The aim of the invention is to create a pneumatic-tube through-transit station which guarantees the least possible stress on all the individual components when a pneumatic-tube carrier is passing through, as well as when it is being received or dispatched, and can be produced with few plastic or synthetic material components which integrate the greatest possible number of functions, and at the lowest possible cost.

According to the invention in the vicinity of one end of the displaceable tube portion there is provided a slider, which slider closes the displaceable tube portion when the slider is in the inserted condition, whereby the two facing ends of the continuous delivery tube are connected with each other by means of an air channel, and the displaceable tube portion, in its position in which it is moved out of the delivery tube, is arranged between a storage hopper, which hopper is provided with a blocking device, and a discharge opening.

Pneumatic-tube carriers which are intended to pass through the pneumatic-tube station can pass through unhindered at whatever high speed desired, just as in the case of the known pneumatic-tube transit stations.

If a pneumatic-tube carrier, which arrives at the end remote from the slider, is to be received, the slider is closed so that an air cushion builds up in the displaceable tube portion and the residual air is conducted by means of the air passage from one end of the delivery tube to the other end of the delivery tube, by-passing the displaceable tube portion, whereby even pneumatic-tube carriers which are being conveyed at a high speed, even those with a heavy load are braked gently and without appreciable mechanical stress on the components of the pneumatic-tube station, and finally come to a stop in the displaceable tube portion, in which stopped condition they are prevented by the slider from moving out of the displaceable tube portion. By means of a simple movement transversely the delivery tube, the displaceable tube portion with the pneumatic-tube carrier is now moved out of the delivery tube until the mouth of the displaceable tube portion, which mouth lies at the slider, comes to lie in front of the discharge opening, whereupon the slider opens the mouth of the displaceable tube portion, and the pneumatic-tube carrier can discharge from the displaceable tube portion through the discharge opening.

The displaceable tube portion can now again be moved into the delivery tube for normal through-passage operation.

If a pneumatic-tube carrier which arrives at the side which is disposed at the slider is to be received, the carrier must first pass through the displaceable tube portion. Only then is this displaceable tube portion closed by the slider, whereupon the course occurs which was described with reference to the carrier arriving at the end remote from the slider. As a result of the air channel or passage, the operation can be converted to suction air operation, after a pneumatic-tube carrier which arrives at the end which is at the slider with the aid of compressed air, has passed through the displaceable tube portion, so that the pneumatic-tube carrier is drawn by suction, back into the intermediate portion which has not yet been displaced. As a consequence of the air passage, no air can escape into the surrounding space, even with compressed air operation, so that the system has particular advantages, for example, in areas with air-conditioning equipment.

For dispatching a pneumatic-tube carrier which is disposed in the storage hopper and which is secured in the hopper by the blocking device, the displaceable tube portion is moved out of the delivery tube, just as with the receiving of a carrier, and is brought to, or respectively, into the storage hopper, and in doing so, one end of the displaceable tube portion is closed by the slider. By releasing the blocking device, the pneumatic-tube carrier to be dispatched can be brought into the displaceable tube portion, being gently braked by the air cushion which is present in the displaceable tube portion, which tube portion hereupon is moved back into the delivery tube. After the slider is opened, the pneumatic-tube carrier can be conveyed to the desired destination station.

It will be seen that the pneumatic-tube station according to the invention can suffice with a minimum of structural components, is subjected to minimal mechanical stress and can therefore also be made from materials such as plastic. In addition, the pneumatic-tube station according to the invention is suitable both for installations or plants which are operated with compressed air and also for installations which are operated with suction air, as well as for installations which are operated with combined compressed and suction air.

Advantageously, the displaceable tube portion is moveable perpendicularly to its longitudinal direction, in a per se known manner, thereby achieving a particularly simple construction.

In accordance with a further development of the invention, in per se known manner, inclined seats which are inclined in a taper or wedge-shaped configuration towards each other are provided at both ends of the displaceable tube portion, the displaceable tube portion being displaceable parallel to the longitudinal axis of the delivery tube. This arrangement not only provides a seat which has a good sealing action and an easy insertion of the displaceable tube portion into the delivery tube, but also insures that a pneumatic-tube carrier passes through smoothly and without shock in the through-transit operation, so that this additional measure also makes it possible for the stress on the material of the pneumatic-tube station to be further reduced.

Expediently, a tube switch which is actuatable by a pneumatic-tube carrier, which tube carrier is disposed in the displaceable tube portion, or respectively, which passes therethrough, is provided in the displaceable tube portion. By means of this single tube switch, it is possible to easily establish whether a pneumatic-tube carrier has been fed in, received, or passed out, or whether a pneumatic-tube carrier has passed through the station.

Advantageously, a check valve which operates toward one direction is provided in the air passage which connects the two ends of the delivery tube. This measure permits suction-pressure operation as well as pressure operation, for conveying carriers in both directions, wherein either a blower is required only at one line connection, or the above-mentioned measure also permits pressurized-pressure operation with blowers which are connected at both ends, which is important particularly when the system is operated in hospitals where air from the rooms must be prevented from penetrating into the delivery tube system, in order to prevent the spread of bacteria.

Expediently, the mouth of the air passage which mouth is remote from the slider, is arranged in the delivery tube spaced at a great distance from the displaceable tube portion, in order to permit pneumatic braking of pneumatic-tube carriers with a heavy load or, respectively, pneumatic braking from high transportation speeds.

Since, as indicated above, the pneumatic-tube station according to the invention is exposed to minimal mechanical stresses, in accordance with a particularly advantageous development of the invention, a housing is provided which accommodates all components of the pneumatic-tube station and which is injection molded from plastic material or hard foam, respectively, and which has, in an integral construction, the air passage, the storage hopper, the inclined seats for the displaceable tube portion, the discharge opening and attachments for guiding the displaceable tube portion, and for the drive which serves to displace the displaceable tube portion, and the control means.

In order also to assure easy manufacture and mounting or assembly of the displaceable tube portion, in accordance with a development of the invention, the displaceable tube portion comprises two half-shells which are injection molded from plastic material or hard foam, respectively, and which are each formed in one piece with the parts of a slider housing which accommodates the slider.

The invention is now described in greater detail with reference to the drawing which shows embodiments of the invention and in which:

FIG. 1 is a diagrammatic view of a pneumatic-tube station according to the invention, with a vertical delivery tube, FIG. 2 shows the part of the displaceable tube portion, which includes the slider, in section taken along the line II—II in FIG. 3, FIG. 3 shows a section taken along line III—III in FIG. 2, FIG. 4 is a diagrammatic view showing another embodiment of the pneumatic tube station.

The pneumatic-tube transit station illustrated in diagrammatic form in FIG. 1 has a housing 1, into which there are inserted delivery tube connections 2 and 3, in a position having the same axes, at the top and the bottom. The connections 2 and 3 are connected to the ends 4 and 5 of a delivery tube line or shaft. The lower mouth of the delivery tube connection 2 and the upper mouth of the delivery tube connection 3 are inclined towards each other in a wedge-like configuration and form sealed inclined seats 6 and 7 for a displaceable tube portion 8 which is inserted into the delivery tube and which tube portion 8 is displaceable parallel and perpendicularly to the longitudinal axis 9 of the delivery tube and the longest generatrix 10 of which tube portion 8 lies at that side of the delivery tube at which the displaceable tube portion 8 can be moved out of the delivery tube. A drive means 11 is provided for displacing the displaceable tube portion 8, the drive means engaging, for example, a toothed bar or rack 12 which is fixedly connected to the displaceable tube portion 8.

The two delivery tube connections 2 and 3 have transfer or overflow openings 13 and 14 which form the mouths of an air passage 15 by means of which the two ends 4 and 5 of the delivery tube, or respectively, the two delivery tube connections 2 and 3, are connected together. In this embodiment, as shown in FIG. 1, a check valve 16 which operates in one direction may be disposed in the air passage 15, which valve 16 permits the flow of air only in the direction of the arrow 17, and thus blocks the flow of air in the other direction.

The housing 1 also has a storage hopper 18 whose lower opening can be closed with a blocking device 19 and which hopper 18 is arranged with a discharge opening having the same axis, parallel to the longitudinal axis 9 of the delivery tube, the discharge opening 20 being provided at the bottom of the housing 1.

With the aid of the actuator or drive 11, the displaceable tube portion 8 can be moved towards the right from the position shown in FIG. 1, perpendicularly with respect to the longitudinal axis 9 of the delivery tube being guided in this orientation by guide members 38, so that the openings of the displaceable tube portion 8 lie opposite the mouth of the storage hopper 18 and, respectively, the discharge opening 20.

Arranged in the displaceable tube portion 8 is a tube switching device 21 which is actuatable by a pneumatic-tube shell or carrier which is present in, or respectively, passes through the displaceable tube portion 8.

As can also be seen from FIG. 1, a slider housing 22 is fixedly connected to the displaceable tube portion 8, and which slider housing is moveable with the displaceable tube portion 8. As shown in broken lines in FIG. 1, a slider 23 is disposed in the slider housing 22, which slider 23 is movable perpendicularly to the longitudinal axis of the displaceable tube portion 8 by means of a slider drive device 24, so that the lower end of the displaceable tube portion 8 can be closed by the slider 23.

The part of the displaceable tube portion 8 which carries the housing or casing 22, the slider 23 and the slider drive device 24 is shown in greater detail in FIGS. 2 and 3. In this embodiment, the displaceable tube portion 8 comprises two half-shell portions 25 and 26 in the form of two semicylinders, which portions 25 and 26, by means of longitudinal ribs 27, 28, 29, 30 attached to the portions 25 and 26, are fixedly connected with each other after the tube switching device 21 has been installed or inserted into the displaceable tube portion 8 and the slide 23 has been installed in or inserted into the slider housing 22. The two half-shell portions 25 and 26 are each respectively formed integrally with the respective parts 31 and 32 of the housing 22 which housing accommodates the slider 23. At its top, the slider 23 has an elongated or oblong recess 33 which is toothed rack shaped at one longitudinal side 34, and which recess 33 is engaged or acted upon by a pinion 35, which pinion can be driven by the slider drive device 24.

In FIGS. 2 and 3, the slider 23 is shown in that position in which it is to be found in its normal state, at which the displaceable tube portion 8 is open for the passage of pneumatic-tube carriers therethrough. If the pinion 35 is moved in a counter-clockwise direction as viewed in FIG. 3, the slider 23 is displaced towards the left until it closes the interior 36 of the tube; if the pinion 35 is rotated in the clockwise direction, the slider 23 is displaced towards the right and the interior 36 of the tube is open.

In the position of the pneumatic-tube station shown in the drawing, pneumatic-tube carriers passing through the delivery tube can pass through the station, since the displaceable tube portion 8 forms a part of the delivery tube. Because the inclined seats 6 and 7 are sealed no feed air can escape.

If a pneumatic-tube carrier is to be dispatched from the pneumatic-tube station shown in the drawing, the carrier is firstly inserted into the storage hopper 18, the lower opening of which is closed by the blocking device 19 so that the inserted carrier cannot fall through the storage hopper 18. Now by means of a device (not shown in the drawing) the destination address can be given, for example, to a central location of the pneumatic tube system and it can be determined there whether or not the station called by the destination address, and the tube system leading thereto is free or open. If the pneumatic-tube system is free for transporting the pneumatic-tube carrier, the drive means or actuator 11 is set in operation from the central location, whereby the displaceable tube portion 8 is brought under the storage hopper 18. At the same time, the slider drive 24 is set in operation and the displaceable tube portion 8 is closed by the slider 23. The blocking device 19 is now actuated, which blocking device 19 opens the storage hopper 18 so that the pneumatic-tube carrier can slide into the displaceable tube portion 8. Since the slider 23 is closing the lower end of the displaceable tube portion 8, no air can escape downwardly from the displaceable tube portion 8 so that, even with a heavier load, the carrier slides very gently into the displaceable tube portion, by virtue of the air cushion present in the displaceable tube portion 8. When the pneumatic-tube carrier which is to be dispatched passes into the displaceable tube portion 8, the tube switching device 21 is actuated by the carrier, whereby the central station receives the information that a pneumatic-tube carrier which is ready to be dispatched is present in the displaceable tube portion 8. Based on this notification, the drive 11 is actuated from the central station, such that the displaceable tube portion 8 with the carrier present therein is brought back into the through-passage position shown in FIG. 1, whereupon the slider drive 24 is also actuated to withdraw the slider 23 into the slide housing 22 and opens the interior 36 of the tube (FIG. 3). The transport blower is now switched on and the pneumatic-tube carrier is dispatched to its destination station.

If the pneumatic-tube station shown in the drawing is to receive a pneumatic-tube carrier arriving for example by means of the delivery tube connection 2 from above, the slider drive 24 is set in operation and the displaceable tube portion 8 of the addressed pneumatic-tube station is closed by the slider 23, when the destination address is supplied by means of the central or control system, if the connecting path is otherwise free. If the check valve 16 is not provided in the air passage 15 and if the cross-section of the air passage 15 is substantially smaller than the cross-section of the delivery tube, the pneumatic-tube carrier can be conveyed to the destination station both by means of compressed air as well as by means of suction air, because the air can flow through the air passage 15 even when the displaceable tube portion 8 is closed by the slider 23. When the carrier arrives at the station, the air which is present between the pneumatic-tube station and the carrier flows on through the air passage 15 further into the delivery tube, which delivery tube is connected to the delivery tube connection 3, whereby a defined air cushion builds up in the displaceable tube portion 8 between the openings 13 and the slider 23, which air cushion brakes the arriving carrier, the carrier finally coming to a halt with its lower edge lying on the slider 23.

Since the pneumatic-tube carrier in so doing actuates the tube switching device 21 of the receiving station, whereby the central control system is notified of the arrival of the carrier, the conveying blower is switched off and the drive device or actuator 11 of the receiving station is placed in operation. Thereby the displaceable tube portion 8 is moved into a position above the discharging opening 20 and the interior 36 of the tube is opened by the slider 23 so that the carrier can slide out of the displaceable tube portion 8 through the discharge opening 20 into a receiving container or vessel (not shown). Thereupon, the displaceable tube portion 8 is returned to the through-passage position shown in the drawing by means of the drive 11.

If a pneumatic-tube carrier is to be received from below, from the direction of the delivery tube connection 3, the slider 23 is initially not actuated, so that the interior 36 of the displaceable tube portion 8 remains free for through-passage operation. Thus, the pneumatic-tube carrier which arrives from below through the delivery tube connection 3 passes through the pneumatic-tube station, beyond the openings 13 of the air passage 15, which openings are located at the upper delivery tube connection 2, and in thus passing the pneumatic-tube carrier actuates the tube switching device 21 which results in the slider drive device 24 being set in operation, and the lower end of the displaceable tube portion 8 is closed. At the same time, the blower which conveys the pneumatic-tube carrier is switched off. Here too the pneumatic-tube carrier now slides from above through the delivery tube connection 2 into the pneumatic-tube station, in which case all those functions occur, which have already been described above in regard to a pneumatic-tube carrier which arrives at the station through the delivery tube connected to the delivery tube connection 2. In this case also, the carrier may be conveyed in a suction air, compressed air or combined suction-pressurized air operation.

If the pneumatic-tube system in question is a system which is to be used to convey heavy materials, or respectively, long pneumatic-tube carriers, precautions can also be taken in this case to insure that the mechanical stress on the pneumatic-tube station remains as low as possible. For this purpose, the air passage 15a (FIG. 4) may be extended upwardly beyond the housing 1 so that the openings 13 are not as shown in FIG. 1 in the interior of the housing 1, but are outside the housing at a greater distance from the housing, so that the air passage 15a opens outside the housing 1 into the delivery tube, which delivery tube is connected to the delivery tube connection 2. Thereby, the size of the air cushion which brakes an incoming pneumatic-tube carrier can be selected according to the requirements.

If the cross-section of the air passage 15 is not substantially smaller than the cross-section of the delivery tube, it is desirable for the check valve 16 to be provided, because this blocks the flow of air which is flowing in the opposite direction to the direction indicated by the arrow 17, when a pneumatic-tube carrier is arriving from below through the delivery tube connection 3. This means that when the carrier is passing through the pneumatic-tube station, or respectively, the displaceable tube portion 8, the conveying air cannot by-pass the displaceable tube portion 8 through the air passage 16, whereby an undesired stoppage of a pneumatic-tube carrier is avoided.

In place of the check valve 16 shown in FIG. 1, it is also possible to install any other uni-directional valve in the passage between the transfer openings 13 and 14, for example air flaps or the like which mask or cover the openings 13.

The invention is not restricted to the embodiment illustrated. Thus, the pneumatic-tube station according to the invention may be arranged with the longitudinal axis 9 of the delivery tube horizontal or inclined at any desired angle to the vertical. Also the surface, which divides the two half-shell portions of the tube portion 8 and the parts of the slider housing, can extend in the plane of the section II—II turned by 90° relative to the surface or joint face 37 as shown in FIG. 3.

I claim:

1. A pneumatic tube station, comprising
   a continuous delivery tube defining two coaxially facing ends and an interrupted space therebetween,
   a displaceable tube portion which can be moved out of the interrupted space of the continuous delivery tube, and respectively, which can be inserted in the interrupted space into the delivery tube, said continuous delivery tube with said tube portion in said interrupted space communicating simultaneously with said two ends being adapted for passage therethrough of pneumatic-tube carriers,
   one seal means each for connecting each respective end of the displaceable tube portion in the position inserted into the delivery tube with the delivery tube,
   a slider slidably disposed in the vicinity of one end of said displaceable tube portion, said slider air-tightly sealingly closes said displaceable tube portion when the slider is in an inserted condition therein,
   means comprising an air channel extending by-passingly exterior to said tube portion and communicatingly connects said two ends of the delivery tube,
   a storage hopper and a discharge opening spaced axially apart from each other,
   said displaceable tube portion in its position in which it is moved out of the delivery tube is arranged between said storage hopper and said discharge opening, a blocking means for blocking said storage hopper.

2. The pneumatic-tube station according to claim 1, wherein said displaceable tube portion is displaceable perpendicularly to its longitudinal direction.

3. The pneumatic-tube station according to claim 2, further comprising
inclined seats which are inclined in a wedge-shaped configuration tapering towards each other are formed at both ends of said displaceable tube portion, and said displaceable tube portion is displaceable parallel to the longitudinal axis of said delivery tube.

4. The pneumatic-tube station according to claim 1, further comprising
a tube switch means for being actuatable by a pneumatic-tube carrier placed in the displaceable tube portion, or respectively, which passes therethrough said displaceable tube portion, said tube switch means is arranged in said displaceable tube portion.

5. The pneumatic-tube station according to claim 1, further comprising
a check valve operating toward one direction is arranged in said air channel which connects said two ends of said delivery tube.

6. The pneumatic-tube station according to claim 1, wherein
said air channel has a mouth located remote from said slider, said mouth is arranged in said delivery tube spaced far from said displaceable tube portion in order to permit a pneumatic braking of pneumatic-tube carriers with a heavy transport load, and respectively, a pneumatic braking from high transportation speeds.

7. The pneumatic tube station according to claim 3, further comprising
a housing accommodates all components of the pneumatic tube station and is injection molded from plastic material or hard foam, respectively, and forms in an integral one-piece construction said air channel, said storage hopper, said inclined seats for said displaceable tube portion, said discharge opening and attachment means for guiding of said displaceable tube portion and for a drive means for displacing the displaceable tube portion, and a control means therefor.

8. The pneumatic-tube station according to claim 1, further comprising
a slider housing holding said slider,
said displaceable tube portion comprises two half-shells which are injection molded from plastic material or hard foam, respectively,
said two half-shells are formed in one piece with parts of said slider housing.

9. The pneumatic-tube station as set forth in claim 1, wherein
said slider is displaceably mounted in said displaceable tube portion.

10. The pneumatic-tube station as set forth in claim 9, further comprising
a slider housing fixedly connected to said displaceable tube portion,
said slider is displaceably mounted in said slider housing,
said slider is formed with an elongated recess formed as a toothed rack,
a slider drive mounted on said slider housing and having a pinion drivably engaging said toothed rack of said slider.

* * * * *